(12) United States Patent  
Liu et al.

(10) Patent No.: US 8,338,263 B1
(45) Date of Patent: Dec. 25, 2012

(54) ETCHING NARROW, TALL DIELECTRIC ISOLATION STRUCTURES FROM A DIELECTRIC LAYER

(75) Inventors: Chia-Ying Liu, Hsinchu (TW); Keh-Chiang Ku, Cupertino, CA (US); Wu-Zhang Yang, Chuang-Huang County (TW)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 13/164,619

(22) Filed: Jun. 20, 2011

(51) Int. Cl.
 *H01L 21/76* (2006.01)
(52) U.S. Cl. ............... 438/413; 438/74; 257/E21.352
(58) Field of Classification Search .............. 438/413, 438/405, 73, 74, 75, 76, 77
 See application file for complete search history.

(56) References Cited

U.S. PATENT DOCUMENTS

| | | | |
|---|---|---|---|
| 6,891,229 B2* | 5/2005 | Franke et al. ............. | 257/354 |
| 7,279,426 B2* | 10/2007 | Hichri et al. ............. | 438/700 |
| 2005/0139828 A1 | 6/2005 | Maruyama | |
| 2005/0179053 A1 | 8/2005 | Ezaki et al. | |
| 2006/0240634 A1* | 10/2006 | Tran ........................... | 438/400 |
| 2008/0128845 A1 | 6/2008 | Hwang et al. | |
| 2008/0135963 A1 | 6/2008 | Akiyama | |
| 2008/0297634 A1 | 12/2008 | Uya | |
| 2011/0159635 A1 | 6/2011 | Doan et al. | |

FOREIGN PATENT DOCUMENTS

| | | |
|---|---|---|
| EP | 1995783 | 11/2008 |
| JP | 2006261372 | 3/2005 |
| JP | 2005150521 | 6/2005 |
| WO | WO-2008/065952 | 6/2008 |
| WO | WO 2010/077315 | 7/2010 |

OTHER PUBLICATIONS

"PCT/US2009/006593 Written Opinion of the International Search Authority", 5 pages.
Doolittle, A. , "Lecture 5 Ion Implantation Reading: Chapter 5", *Georgia Tech*, http://users.ece.gatech.edu/~alan/ECE6450/Lectures/ECE6450L5-Ion%20Implantation.pdf, downloaded from the internet Jun. 20, 2011, 21 pages.
Gui, D. , et al., "Evaluation of Stopping Power of Photo-resist to Ion Implantation by Using SIMS", *ICSE2006 Proc. 2006*, Kuala Lumpur, Malaysia, 2006, pp. 481-484.
PCT International Search Report (PCT/US2009/006593), Mar. 12, 2010, 4 pgs.

\* cited by examiner

*Primary Examiner* — Charles Garber
*Assistant Examiner* — Reema Patel
(74) *Attorney, Agent, or Firm* — Blakely, Sokoloff, Taylor & Zafman LLP (57) ABSTRACT

Methods of forming isolation structures are disclosed. A method of forming isolation structures for an image sensor array of one aspect may include forming a dielectric layer over a semiconductor substrate. Narrow, tall dielectric isolation structures may be formed from the dielectric layer. The narrow, tall dielectric isolation structures may have a width that is no more than 0.3 micrometers and a height that is at least 1.5 micrometers. A semiconductor material may be epitaxially grown around the narrow, tall dielectric isolation structures. Other methods and apparatus are also disclosed.

11 Claims, 6 Drawing Sheets

ETCHING NARROW, TALL DIELECTRIC ISOLATION STRUCTURES FROM A DIELECTRIC LAYER

BACKGROUND

1. Field

This disclosure relates generally to electrical isolation structures for integrated circuits, and in particular but not exclusively, relates to electrical isolation structures for image sensors.

2. Background Information

Image sensors typically include pixel arrays that include electrical isolation regions between adjacent pixels. The isolation regions help to electrically isolate or insulate the adjacent pixels from one another.

Figure 1:
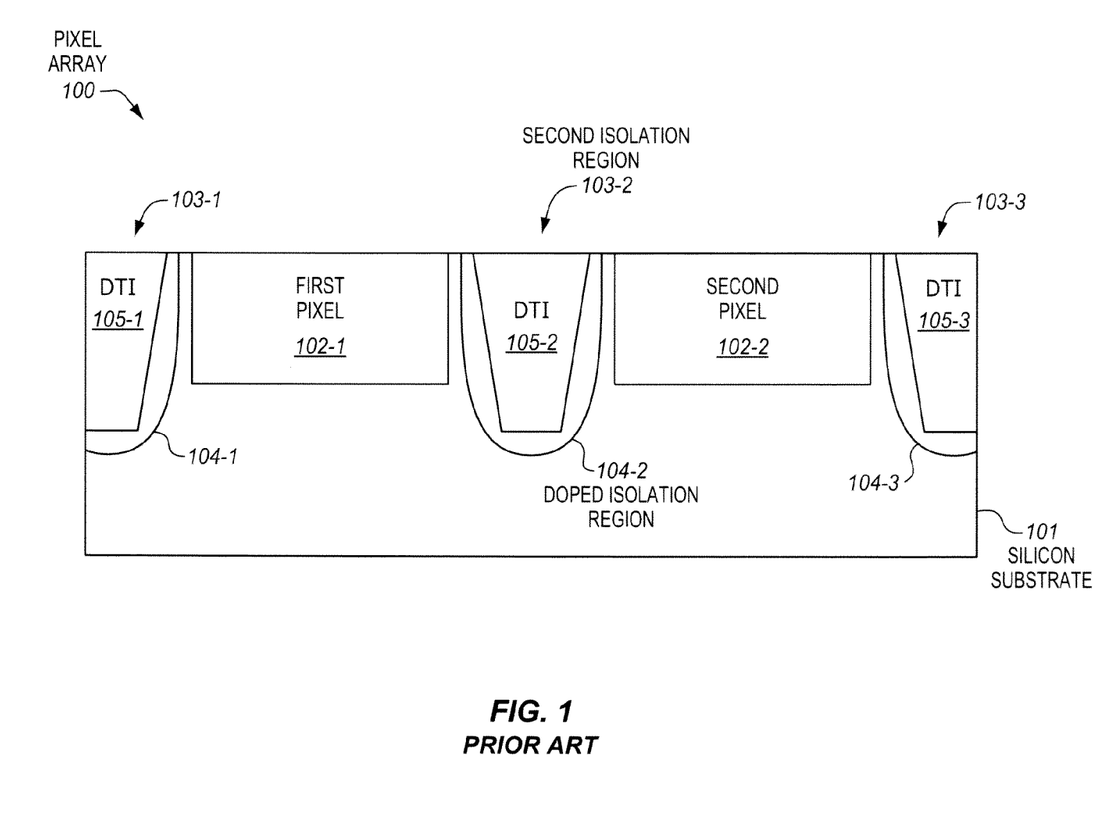
FIG. 1 is a cross-sectional side view of a simple two-pixel example of a pixel array that includes isolation regions.

FIG. 1 is a cross-sectional side view of a simple two-pixel example of a pixel array. The pixel array has a first pixel 102-1 and a second pixel 102-2 formed within a silicon substrate 101. The pixel array also includes a first isolation region 103-1, a second isolation region 103-2, and a third isolation region 103-3. The first isolation region 103-1 may be disposed between the first pixel 102-1 and another pixel (not shown) that is positioned to the left of the first pixel, the second isolation region 103-2 is disposed between the first and second pixels 102-1, 102-2, and the third isolation region 103-3 may be disposed between the second pixel 102-2 and another pixel (not shown) that is positioned to the right of the second pixel.

Each of the isolation regions includes a corresponding doped isolation region 104-1, 104-2, 104-3, and a corresponding deep trench isolation (DTI) 105-1, 105-2, 105-3. The doped isolation regions represent doped regions or wells formed within the silicon substrate that include a dopant of a type that is operable to make doped isolation regions that electrically separate the photogenerated carriers of adjacent pixels. The doped isolation regions begin near the upper surface of the silicon substrate and extend into the silicon substrate to a depth appropriate to help isolate the adjacent pixels.

The DTIs 105 are disposed within the doped isolation regions 104. DTI has been employed relatively recently as an alternative to shallow trench isolation (STI) in an effort to improve the amount of isolation of the adjacent pixels. Each of the DTIs represents a deep trench that has been etched into the silicon substrate and then filled by adding silicon dioxide into the deep trench. The DTIs begin near the upper surface of the silicon substrate and extend part way through the doped isolation regions. As the names implies, DTI is typically significantly deeper than STI.

Over the years the size of pixels in image sensors has decreased significantly. The reduction in the size of the pixels has been motivated in part by factors such as a desire to provide increased image sensor resolution, reduced image sensor size, reduced image sensor manufacturing costs, reduced image sensor power consumption, or the like. Further reductions in the sizes of the pixels are desirable.

One factor that contributes to the size of the pixels and/or the pixel array is the width of the trench isolation (e.g., DTI 105 or STI). The smaller the widths of the trench isolation, the more closely together the pixels may be packed within the pixel array. Accordingly, it would be desirable to reduce the width of the trench isolation. However, reducing the width of the trench isolation tends to be challenging. For one thing, it tends to be challenging to etch a narrow, deep trench into the silicon substrate. For another thing, it tends to be challenging to fill such a narrow, deep trench in the silicon substrate with silicon dioxide without creating voids, stress, or defects. This would be especially the case if the width of the trench isolation were to be less than about 0.3 micrometers (μm).

BRIEF DESCRIPTION OF THE SEVERAL VIEWS OF THE DRAWINGS

The invention may best be understood by referring to the following description and accompanying drawings that are used to illustrate embodiments of the invention. In the drawings.

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure the understanding of this description.

FIGS. 2A-2J are cross-sectional side views of substrates representing different stages of an example embodiment of a method of forming narrow, tall, dielectric isolation structures in a semiconductor substrate. In some embodiments, the method may be performed during the manufacture of an image sensor. In various aspects, the image sensor may be either a front side illuminated (FSI) image sensor, or a back side illuminated (BSI) image sensor. The pixels may be complementary metal oxide semiconductor (CMOS) pixels, charge coupled device (CCD) pixels, or other types of pixels known in the image sensors arts.

As will be explained, in some embodiments, rather than etching a narrow, deep trench into a substrate, and then filling the narrow, deep trench with a dielectric or insulating material in order to form a narrow, deep isolation structure, an alternate approach is employed. In the alternate approach, a narrow, tall, dielectric isolation structure is etched or formed from a dielectric or insulating layer. The narrow, tall, dielectric isolation structure represents a portion of the dielectric layer that remains after etching. Advantageously, this approach may allow narrow, tall, dielectric isolation structures to be formed without having to etch a narrow, deep trench in a substrate and fill the narrow, deep trench with a dielectric or insulating material.

Figure 2A:
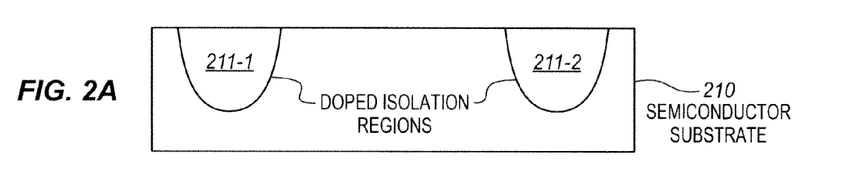
FIGS. 2A-2J are cross-sectional side views of substrates representing different stages of an example embodiment of a method of forming narrow, tall, dielectric isolation structures in a semiconductor substrate.

FIG. 2A shows a semiconductor substrate 210 having a first doped isolation region 211-1 and a second doped isolation region 211-2 formed therein. The doped isolation regions begin near an upper surface of the semiconductor substrate and extend into the semiconductor substrate to a depth appropriate to help isolate adjacent pixels that are to be subsequently formed on opposite sides of the doped isolation regions. The doped isolation regions represent doped regions or wells formed within the semiconductor substrate that include a dopant of a type that is operable to make doped isolation regions that electrically separate the photogenerated carriers of adjacent pixels.

A semiconductor may be doped with a dopant to alter its electrical properties. Dopants may either be acceptors or donors. Acceptor dopants generate excess holes in the semiconductor whose atoms they replace by accepting electrons from those semiconductor atoms. Examples of suitable acceptors include boron, indium, gallium, aluminum, and combinations thereof. A "p-type semiconductor", a "semiconductor of p-type conductivity", or the like, refers to a semiconductor doped with an acceptor, and in which the concentration of holes is greater than the concentration of free electrons. In one embodiment, the doped isolation regions 211-1, 211-2 are doped to be p-type semiconductors or semiconductors of p-type conductivity. In some embodiments, the doped isolation regions may be heavily doped. For example, the doped isolation regions may be p+ regions. The heavily doped regions or p+ regions may have concentrations of dopant that are more than about $1 \times 10^{15}$ dopant atoms/cm$^3$, sometimes more than about $2 \times 10^{15}$ dopant atoms/cm$^3$.

The doped isolation regions may be formed by implanting or otherwise introducing dopant into the semiconductor substrate, for example through a dopant implantation process. Conventional methods of forming these doped isolation regions are suitable.

Figure 2B:
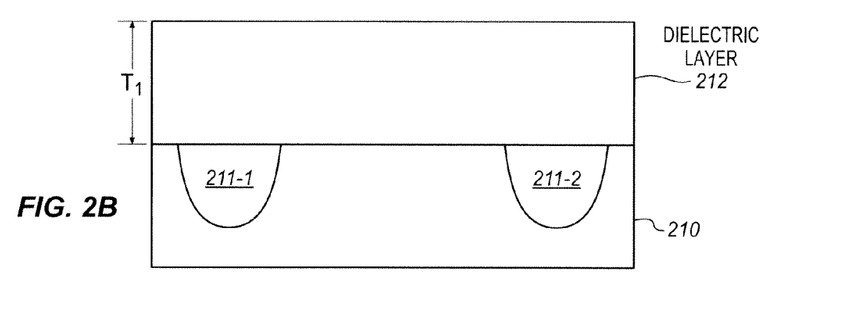

FIG. 2B shows forming a dielectric layer 212 over the semiconductor substrate 210. The dielectric layer is or predominantly includes a dielectric material that is electrically insulating or that resists the flow of electric charge. A few representative examples of suitable dielectric materials include, but are not limited to, oxides of semiconductors, such as oxides of silicon (e.g., silicon dioxide, $SiO_2$), oxy-nitrides of semiconductors (e.g., oxy-nitrides of silicon), oxides of metals, high dielectric constant (high-k) materials, glasses, materials suitable for filling the trenches in STI, materials suitable for filling the trenches in DTI, other dielectric or insulating materials known in the arts suitable for handling subsequent processing conditions (e.g., temperatures), and combinations thereof.

The high-k material may have a higher dielectric constant than that of silicon dioxide (i.e., higher than about 4.0). Examples of high-k dielectric materials include, but are not limited to, hafnium based materials, hafnium-silicon materials (e.g., hafnium silicate), oxides of hafnium (e.g., hafnium dioxide), zirconium based materials, zirconium-silicon materials (e.g., zirconium silicate), oxides of zirconium (e.g., zirconium dioxide). Combinations of two or more dielectric materials may also optionally be used. The different dielectric materials may either be combined within the same layer or different layers of different materials may be employed. In some embodiments, silicon dioxide ($SiO_2$) may be used, although this is not required.

In some embodiments, the dielectric layer 212 may be formed by depositing a dielectric material to form a layer. For example, an oxide of a semiconductor, an oxide of a metal, a high-k dielectric material, a glass, or another dielectric material may be deposited or introduced over the top major surface of the semiconductor substrate 210 to form the layer. Examples of suitable forms of deposition include, but are not limited to, chemical vapor deposition (CVD), physical vapor deposition (PVD), atomic layer deposition (ALD), spin coating (e.g., for a spin-on glass), and other forms of deposition.

In other embodiments, the dielectric layer 212 may be formed by growing a layer of a dielectric material over the top major surface of the semiconductor substrate 210. For example, the surface may include silicon or other semiconductor and the dielectric layer may be a layer of a thermally grown oxide of silicon (e.g., silicon dioxide, $SiO_2$) or a thermally grown oxide of another semiconductor. A combination of deposition and growth may also optionally be used.

As shown in the illustration, the dielectric layer 212 has a thickness (T1). As will be explained further below, the thickness (T1) may be at least as great as the intended height of the narrow, tall, dielectric isolation structures, which are to be etched or formed from the dielectric layer. In various embodiments, the thickness (T1) may be at least 1.5 micrometers (µm), at least 1.6 µm, at least 1.7 µm, at least 1.8 µm, at least 1.9 µm, at least 2 µm, or an even greater thickness. In some embodiments, the thickness (T1) ranges from about 1.5 µm to about 2.2 µm.

Figure 2C:
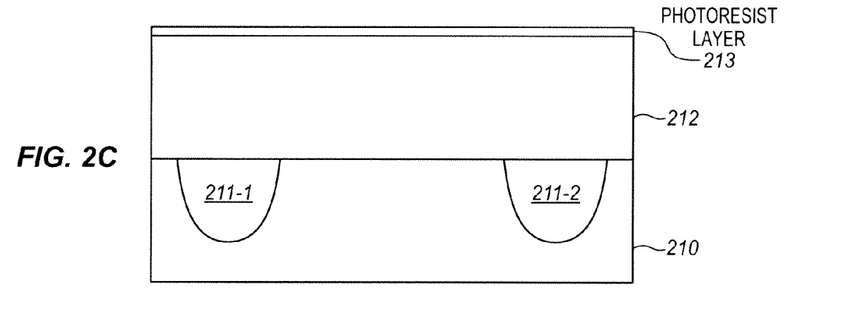

FIG. 2C shows forming a thin photoresist layer 213 over the dielectric layer 212. The photoresist layer may be formed over the dielectric layer using conventional approaches known in the arts. For example, the photoresist layer may be formed by dispensing or otherwise applying a photoresist material over the top major surface of the dielectric layer, and spinning or otherwise forming the photoresist material into the thin layer.

Figure 2D:
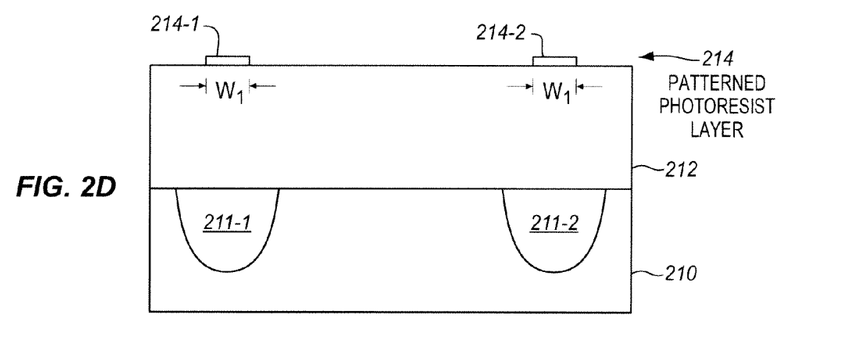

FIG. 2D shows patterning the photoresist layer 213 to form a patterned photoresist layer 214. The patterned photoresist layer includes a first narrow portion 214-1 and a second narrow portion 214-2. The patterned photoresist layer may be formed lithographically. For example, a photolithographic exposure through a mask may be used to pattern the first and second narrow portions, the exposed photoresist layer may then optionally be baked, and then developed in order to remove portions of the photoresist layer around the first and second narrow portions. The portions of the photoresist layer that are removed may either be exposed portions or unexposed portions, depending upon the particular type of photoresist.

As will be explained further below, the first and second narrow portions represent narrow isolation structure defining portions that will subsequently be used to define or form narrow isolation structures 215-1, 215-2 from the dielectric layer 212. As shown in the illustration, the first and second narrow portions 214-1, 214-2 may each have a width (W1). In various embodiments, the width (W1) may be less than about 0.3 µm, less than about 0.25 µm, less than about 0.2 µm, or even less. In some embodiments, the width (W1) may range between about 0.15 µm and 0.3 µm. However, the scope of the invention is not limited to forming the first and second portions with such narrow widths. In one aspect, the first and second narrow portions may each be elongated extending into the plane of the page in order to define elongated narrow, tall wall-shaped isolation structures.

Figure 2E:
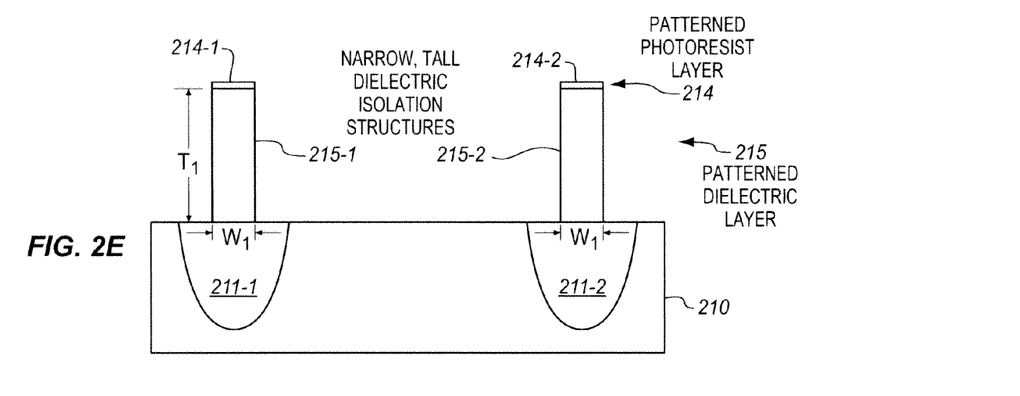

FIG. 2E shows forming a patterned dielectric layer 215 having a first narrow, tall, dielectric isolation structure 215-1 and a second narrow, tall, dielectric isolation structure 215-2. In one aspect, these narrow, tall, dielectric isolation structures may extend into the plane of the page as narrow, tall, wall-shaped isolation structures. These narrow, tall, dielectric isolation structures will serve as replacements for the conventional dielectric filled trenches of STI or DTI.

The narrow, tall, dielectric isolation structures 215-1, 215-2 may be formed by etching or patterning the dielectric layer 212. This may include contacting and/or exposing portions of the top surface of the dielectric layer that are not concealed by and/or that do not underlie the first and second narrow portions 214-1, 214-2 of the patterned photoresist layer to one or more etchants and/or an etching medium. The etchants may include one or more plasmas, one or more gases, one or more solutions, or a combination thereof, which are sufficient to etch the dielectric layer and leave behind the narrow, tall, dielectric isolation structures.

In some embodiments, the etch may be an anisotropic etch or orientation dependent etch that may etch faster or preferentially in a vertical direction (as viewed), or a direction through the dielectric layer, as compared to a horizontal direction (as viewed), or a direction laterally within the dielectric layer. For example, an anisotropic plasma etch, such as, for example, a reactive ion etch (RIE), may optionally be used. The RIE may include a dry-etch process that may use electrical discharge to create ions and induce ion bombardment based etching of the horizontal surfaces of the dielectric layer not concealed by the first and second narrow photoresist portions. As one specific example, in an embodiment where the dielectric layer is a silicon dioxide layer, the etch may include a fluorine ion based RIE. Other etchants suitable for etching other dielectric materials mentioned above are known in the arts and/or can be readily selected by those skilled in the art and having the benefit of the present disclosure. Alternatively, other anisotropic etches and/or other orientation dependent etches besides RIE may optionally be used.

The narrow, tall dielectric isolation structures 215-1, 215-2 are portions of the dielectric layer that remain after the etch. During the etch the first and second narrow portions 214-1, 214-2 of the patterned photoresist layer may be used as etch masks to mask the etch from underlying portions of the dielectric layer. As shown, the first and second narrow, tall, dielectric isolation structures may substantially underlie, and may be substantially coextensive with, the respective first and second narrow portions of the patterned photoresist layer. Portions of the dielectric layer not substantially underlying and/or not substantially coextensive with the first and second narrow portions of the patterned photoresist layer have been etched away. As shown, the width (W1) of the first and second narrow portions 214-1, 214-2 of the patterned photoresist layer may be substantially reproduced into the first and second narrow, tall, dielectric isolation structures 215-1, 215-2. As previously mentioned, in various embodiments, the width (W1) may be less than about 0.3 μm, less than about 0.25 μm, less than about 0.2 μm, or even less. In some embodiments, the width (W1) may range between about 0.15 μm and 0.3 μm. However, the scope of the invention is not limited to such narrow widths.

As also shown, in some embodiments, the first and second narrow, tall, dielectric isolation structures may have a height substantially equal to the thickness (T1) of the dielectric layer 212. The etch may be performed through substantially an entire thickness of the dielectric layer. The etch may stop at or near the top surface of the semiconductor substrate. The bottoms of the first and second narrow, tall, dielectric isolation structures may reside at or near the top major surface of the starting semiconductor substrate. In contrast, the bottoms of the filled trenches in STI and DTI lie deeply within substrate. As previously mentioned, in various embodiments, the thickness (T1) may be at least 1.5 micrometers (μm), at least 1.6 μm, at least 1.7 μm, at least 1.8 μm, at least 1.9 μm, at least 2 μm, or an even greater thickness. In some embodiments, the thickness (T1) ranges from about 1.5 μm to about 2.2 μm. However, the scope of the invention is not limited to such thicknesses.

For certain materials used for the dielectric layer and/or for certain etches, the top major surface of the semiconductor substrate may serve as an etch stop for the etch (e.g., a significantly lower etch rate than that of the dielectric layer). If desired, an optional etch stop layer (not shown) may optionally be included immediately between the top major surface of the semiconductor substrate and the dielectric layer to facilitate stopping the etch at a point after etching through the dielectric layer has completed. Alternatively, accurate control over the timing of the etch and/or accurate etch endpoint detection may alternatively be used to stop the etch at an appropriate time without the need to include an etch stop layer. As yet another option, the etch may etch a bit into the semiconductor substrate.

Advantageously, the narrow, tall dielectric isolation structures have been formed or etched from the dielectric layer, as opposed to being dielectric material added into a trench to fill the trench. As a result, the narrow, tall dielectric isolation structures may typically have a higher density and/or quality dielectric material (e.g., less voids, less defects, and/or less stress) than would typically be readily achievable for the case of dielectric material added into a trench to fill the trench. This tends to be especially the case for deep trenches having depths of at least 1.5 μm which have narrow widths of less than about 0.3 μm.

Figure 2F:
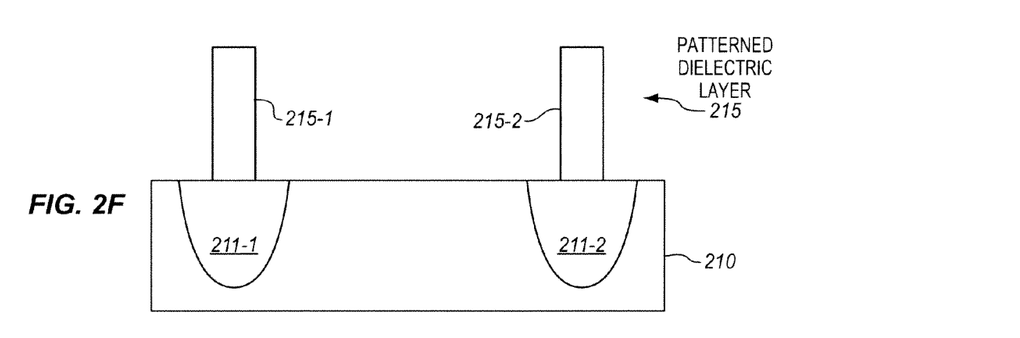

FIG. 2F shows optionally removing the patterned photoresist layer 214 from over the top surface of the patterned dielectric layer 215. By way of example, the patterned photoresist layer may be removed by conventional resist stripping approaches. Alternatively, the patterned photoresist layer may be removed at another stage of the method (e.g., after one or more subsequent operations).

Figure 2G:
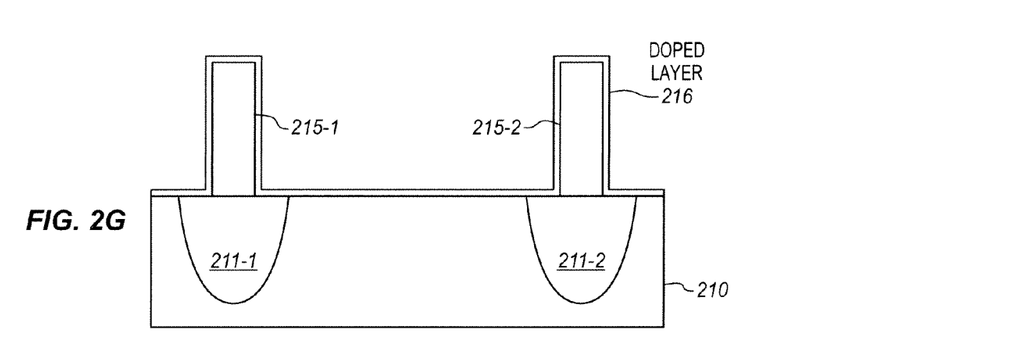

FIG. 2G shows depositing or forming a thin conformal doped layer 216 over exposed surfaces of the patterned dielectric layer 215 and over the top major surface of the semiconductor substrate 210. As shown, the doped layer may be deposited or formed conformally on the tops and vertical sidewalls of the first and second narrow, tall, dielectric isolation structures 215-1, 215-2 as well as on exposed portions of the top major surface of the semiconductor substrate surrounding the first and second narrow, tall, dielectric isolation structures.

The thin conformal doped layer 216 may include a base material that is doped with one or more dopants. In some embodiments, the dopants may be one or more acceptor dopants. Suitable acceptor dopants for silicon include, but are not limited to, boron, indium, gallium, aluminum, and combinations thereof. In other embodiments, the dopants may be one or more donor dopants. Suitable donor dopants for silicon include, but are not limited to, phosphorous, arsenic, antimony, and combinations thereof. Acceptor and donor dopants for other semiconductors are known in the arts. In some embodiments, the doped layer may be relatively highly or highly doped with dopants. For example, in one example embodiment, a concentration of the dopants in the doped layer may range between about $1 \times 10^{14}$ dopant atoms/cm$^3$ to about $1 \times 10^{15}$ dopant atoms/cm$^3$. In some embodiments, the doped layer is a boron doped layer.

The types of dielectric materials mentioned above for the dielectric layer 212 are generally also suitable for the base material of the doped layer 216 to which the dopant is added. For example, the doped layer may include doped oxides of semiconductors (e.g., doped silicon dioxide or other doped oxides of silicon), doped oxy-nitrides of semiconductors, doped oxides of metals, doped high-k materials, doped glasses, materials suitable for STI trenches that have been doped, materials suitable for DTI trenches that have been doped, or combinations thereof. In some embodiments, the doped layer may have a same material (although doped) as that of the dielectric layer. For example, in one embodiment, the dielectric layer may include an oxide of silicon and the doped layer may include a doped oxide of silicon.

Other examples of materials that are suitable for the doped layer 216 include doped semiconductors (e.g., doped silicon materials, doped silicon germanium materials, etc.), doped borosilicate glasses, etc. For example, in one embodiment, the dielectric layer may include an oxide of silicon, whereas the doped layer may include a doped semiconductor (e.g., a doped silicon material or a doped silicon germanium material). In some embodiments, the doped semiconductor may be the same type of semiconductor material as a semiconductor material 219-1, 219-2, 219-3 (please refer to FIG. 2I) that is to be subsequently formed alongside the first and second narrow, tall, dielectric isolation structures 215-1, 215-2, as will be explained further below.

As mentioned above, in some embodiments, it is desirable to form the isolation structures 215-1, 215-2 to have narrow widths (W1), for example of less than about 0.3 μm. Since the thickness of the doped layer may tend to increase the width of these isolation structures, in such embodiments, it may be desirable for the doped layer to have a narrow thickness of less than about 100 nanometers (nm), less than about 80 nm, less than about 60 nm nanometers, or less than about 50 nm. In some embodiments, the thickness may range from about 30 nm to about 70 nm. In some embodiments, the doped layer 216 may be deposited by atomic layer deposition (ALD). Advantageously, the use of ALD may allow potentially very thin and very conformal layers to be deposited with relatively precise control over the thickness of the deposited layer. Alternatively, other methods of deposition, such as, for example, chemical vapor deposition (CVD) or physical vapor deposition (PVD), may optionally be used, and controlled to provide the thickness desired for the particular implementation.

Figure 2H:
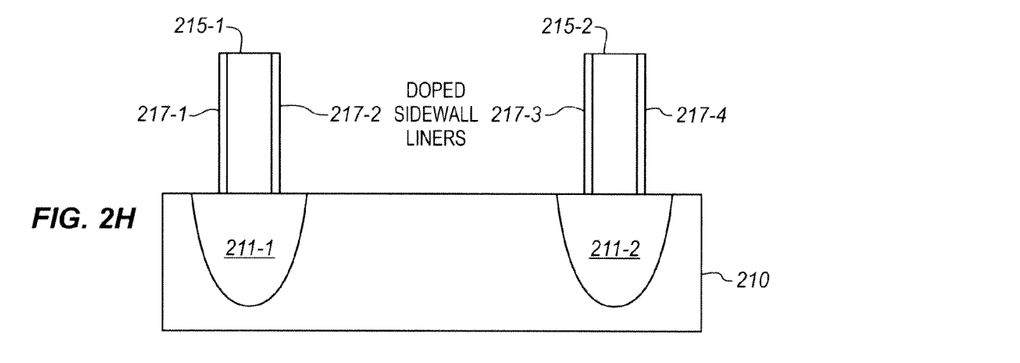

FIG. 2H shows removing portions of the thin conformal doped layer 216 from over the tops of the first and second narrow, tall, dielectric isolation structures 215-1, 215-2 and from over exposed portions of the top major surface of the semiconductor substrate 210 surrounding the narrow, tall, dielectric isolation structures. As shown, portions of the doped layer are allowed to remain on the vertical sidewalls of the first and second narrow, tall, dielectric isolation structures as doped sidewall liners 217-1, 217-2, 217-3, 217-4.

As will be explained further below, dopant from the doped sidewall liners 217-1, 217-2, 217-3, 217-4 will subsequently be thermally diffused or otherwise introduced into semiconductor materials 219-1, 219-2, 219-3 (please refer to FIG. 2I) that are to be formed adjacent to the doped sidewall liners. Removing the portions of the doped layer from over the top of the semiconductor substrate around the dielectric isolation structures is desirable to prevent dopant from being introduced into unintended regions of the semiconductor substrate. In some embodiments, the portions of the doped layer may be removed by performing an anisotropic etch or other orientation dependent etch. For example, an anisotropic plasma etch, such as a reactive ion etch (RIE), may be used.

Figure 2I:
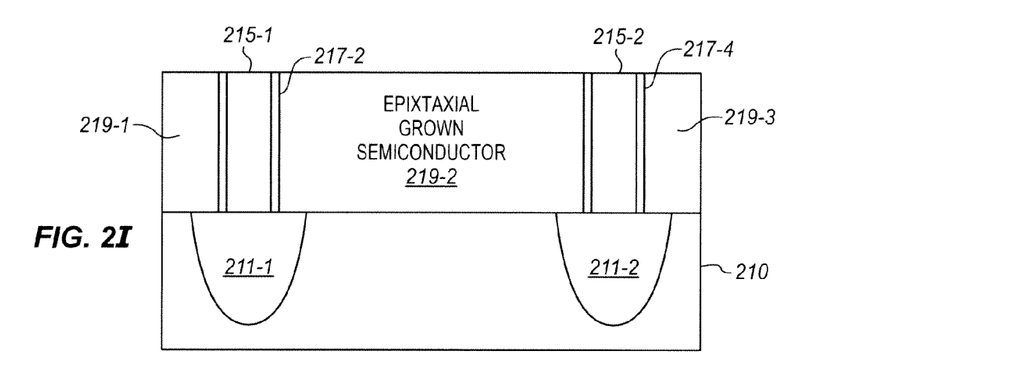

FIG. 2I shows epitaxially growing a layer of semiconductor material 219-1, 219-2, 219-3 around the first and second narrow, tall, dielectric isolation structures 215-1, 215-2. The layer of the epitaxial material may surround and fill in the space between the narrow, tall, dielectric isolation structures.

In some embodiments, the epitaxially grown semiconductor material may be an epitaxially grown single crystal silicon or semiconductor material. In other embodiments, the epitaxially grown semiconductor material may be an epitaxially grown crystalline compound semiconductor material, such as, for example, an epitaxially grown crystalline compound silicon germanium material. As will be explained further below, in one aspect, the epitaxially grown semiconductor material may be the same as a semiconductor material in a periphery region. Alternatively, in another aspect, the epitaxially grown semiconductor material (e.g., an epitaxial crystalline silicon germanium material) may be different than a semiconductor material in a periphery region (e.g., epitaxial single crystal silicon).

In some embodiments, a selective epitaxial growth process may optionally be used. The selective epitaxial growth process may grow the semiconductor material faster and/or preferentially on a semiconductor starting material, for example the exposed semiconductor of the top major surface of the semiconductor substrate, as compared to on a dielectric or insulating material (e.g., an oxide of silicon of the doped sidewall liners). Such selective epitaxial growth may tend to build up the layer from the bottom up, rather than having a significant component of growth laterally inward from the sides of the narrow, tall dielectric isolation structures. However, selective epitaxial growth is optional and not required.

In some embodiments, a high temperature selective or ordinary epitaxial growth process may optionally be used. The higher temperatures may help to increase the growth rate and/or help to reduce defects in the epitaxial material, but are not required.

As shown, in one aspect, a thickness of the layer of the epitaxial material may be substantially equal to (or alternatively optionally taller than) the height of the narrow, tall dielectric isolation structures.

In some embodiments, an optional planarization operation may optionally be performed to planarize the top surface of the substrate so that the tops of the narrow, tall dielectric isolation structures and the top surface of the epitaxial semiconductor layer are substantially coplanar. An example of a suitable planarization operation is chemical mechanical polishing (CMP). Alternatively, the planarization operation may be omitted by controlling the rate of the growth of the epitaxial layer and/or by detecting the end point for the growth of the epitaxial layer such that the top surface is sufficiently planar without such a planarization operation.

Figure 2J:
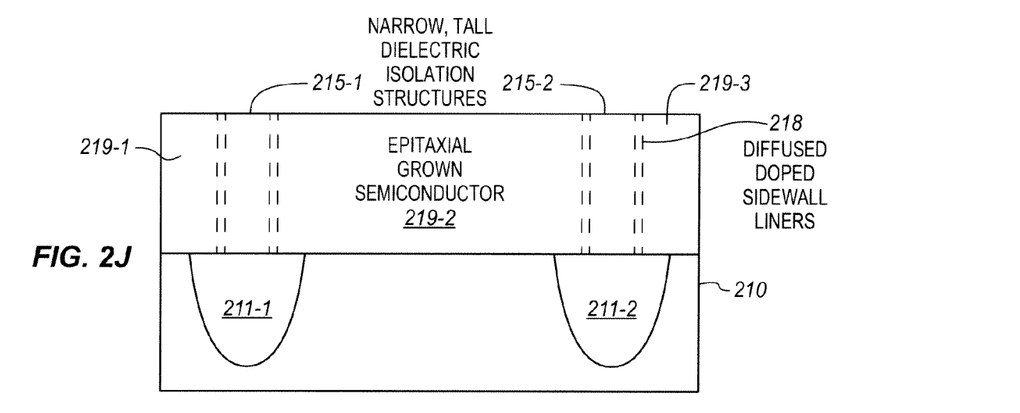

FIG. 2J shows diffusing or driving dopant of the doped sidewall liners 217-1, 217-2, 217-3, 217-4 into adjacent portions of the epitaxial semiconductor layer 219-1, 219-2, 219-3. In some embodiments, diffusing or driving the dopant into the epitaxial semiconductor material may be performed by a thermal process (e.g., a thermal diffusion process). In one aspect, the thermal process may expose the doped sidewall liners to an elevated temperature, for example ranging from about 800° C. to about 1300° C., or from about 900° C. to about 1200° C., for a brief period of time, for example ranging from several seconds to several minutes, or from about 20 seconds to about 3 minutes. Generally, the higher the temperature the shorter the time, or the lower the temperature the longer them time. These specific temperatures and times are merely examples and are not required. In some embodiments, a separate, dedicated thermal process is not required, such as, for example, if a subsequent thermal process is sufficient to diffuse the dopant to the desired extent. This may be the case, for example, for a subsequent thermal gate oxidation operation and/or a subsequent well drive operation.

The diffusion or drive in process may essentially disperse or blend the dopant within the adjacent portions of the semiconductor material. As previously mentioned, in some embodiments, the dopant may be a p-type or acceptor dopant, which is operable to make the adjacent semiconductor material also be p-type semiconductor and/or have p-type conductivity. This may help to provide a p-type layer around a N+ region of a photodiode. Alternatively, opposite dopants types may optionally be used for these regions.

The approach shown and described is merely one example, and the scope of the invention is not limited to merely this one example. Certain operations may optionally be added to and/ or removed from this approach and/or certain operations may be performed in a different order. For example, the narrow resist structures 214-1, 214-2 may be removed after the formation of the narrow, conformal doped layer 216. As another example, an optional etch stop layer may be formed beneath the dielectric layer 212 to help stop the etch. As yet another example, the drive in process may be performed at a later stage of manufacturing. Many modifications and adaptations may be made to the method and are contemplated. It is also to be appreciated that methods, including claimed methods, lie in subsets of the set of operations.

Subsequently, substantially conventional further processing operations may be performed to form photodiodes and/or pixels within the epitaxial semiconductor layer between the narrow, tall, dielectric isolation structures. In some embodiments, the pixels may be 1.75 μm or smaller pixels, or 1.4 μm or smaller pixels, although the scope of the invention is not so limited. Advantageously, the narrow, tall, dielectric isolation structures may help to improve the amount of isolation of adjacent photodiodes and/or pixels (e.g., help to reduce crosstalk, blooming, junction leakage, etc.). Peripheral circuits may be formed in peripheral regions of the pixel array, etc. In the case of a BSI image sensor, the backside surface of the semiconductor substrate may be thinned to approximately near the bottom of the narrow tall isolation structures. The scope of the invention is not limited to any known such subsequent operations.

Consider momentarily the starting semiconductor substrate (e.g., semiconductor substrate 210) that is used as a starting substrate for the approach. In some embodiments, this starting substrate may be a highly doped semiconductor substrate, for example having a thickness of around 200 μm, which has a lightly doped epitaxial semiconductor layer, for example with a thickness of around 2-10 μm, grown thereon. The pixel array or other integrated circuitry are to be formed using this lightly doped epitaxial semiconductor layer. However, this lightly doped epitaxial semiconductor layer tends to increase the cost of providing the starting substrate. Another option, in embodiments of the invention, is to instead start with the highly doped semiconductor substrate, for example having a thickness of around 200 μm, without the lightly doped epitaxial semiconductor layer formed thereon. The epitaxial layer grown as described above may replace the epitaxial layer in the conventional starting wafers. This may allow use of a less costly starting substrate, but is not required.

In some embodiments, the epitaxial semiconductor material 219-1, 219-2, 219-3 used for the pixel array may be the same type of semiconductor material as that used for the peripheral region/circuits. For example, both may be single crystal silicon (e.g., epitaxial silicon). As another example, both may be a crystalline silicon germanium material.

Alternatively, in other embodiments, the epitaxial semiconductor material 219-1, 219-2, 219-3 used for the pixel array may be a different type of semiconductor material than that used for the peripheral region/circuits. For example, the semiconductor material used for the peripheral region/circuits may be single crystal silicon (e.g., epitaxial silicon), whereas the epitaxial semiconductor material 219-1, 219-2, 219-3 used for the pixel array may be a different type of semiconductor material, such as, for example, to provide different light detection characteristics than that of single crystal silicon (e.g., a silicon germanium material). Using single crystal silicon (e.g. p-type doped single crystal silicon) in the peripheral region/circuits may facilitate the use of standard complementary metal oxide semiconductor (CMOS) processing to form the transistors and/or circuits in the peripheral region. In some embodiments, the transistors and/or circuits in the peripheral region outside of the pixel array may optionally use STI, since enhanced isolation by narrow, tall dielectric isolation structures as disclosed elsewhere herein is generally not needed for these peripheral circuits. This may help to avoid needing to modify existing design rules associated with the peripheral region/circuits. Alternatively, the narrow, tall dielectric isolation structures as disclosed elsewhere herein may optionally be used in the peripheral region/circuits, if desired.

Figure 3A:
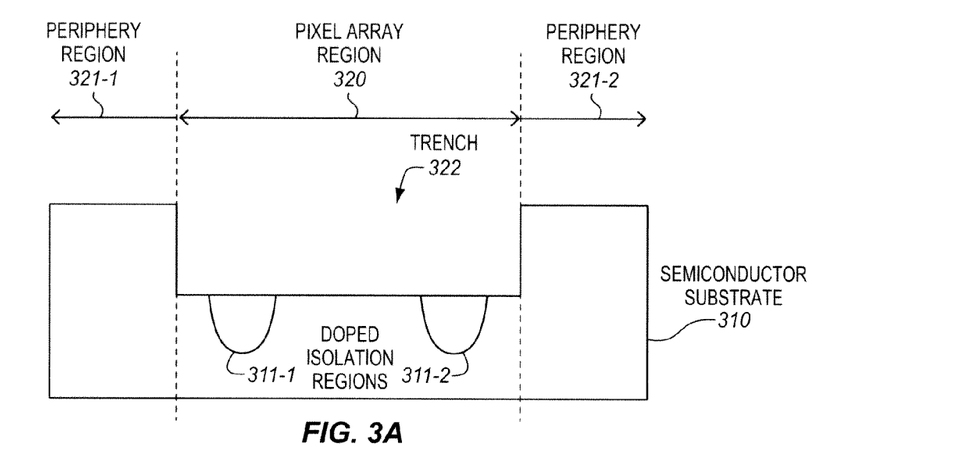
FIGS. 3A-3C are cross-sectional side views of substrates representing different stages of an example embodiment of a method of forming narrow, tall, dielectric isolation structures for a pixel array in an epitaxial semiconductor material within a trench in a semiconductor substrate having a different type of semiconductor material.
Figure 3B:
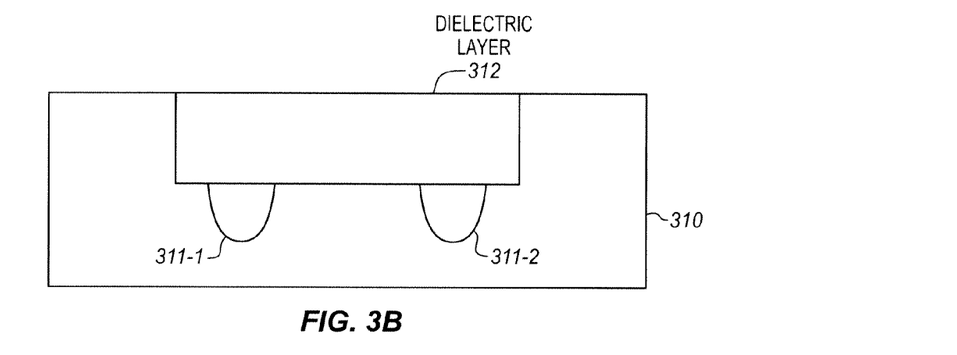
Figure 3C:
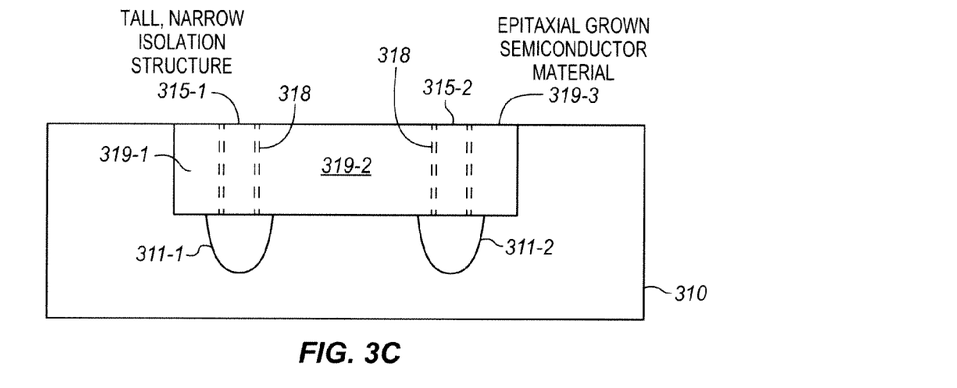

FIGS. 3A-3C are cross-sectional side views of substrates representing different stages of an example embodiment of a method of forming narrow, tall, dielectric isolation structures 315-1, 315-2 for a pixel array in an epitaxial semiconductor material 319-1, 319-2, 319-3 within region corresponding to a trench 322 in a semiconductor substrate 310 having a different type of semiconductor material.

FIG. 3A shows a semiconductor substrate 310 of a first type of semiconductor material (e.g., silicon) having a trench 322 formed or defined within a top major surface of the semiconductor substrate. The trench corresponds in extent to an intended location of a pixel array region 320. Outside of the trench lie portions of the semiconductor substrate at intended locations of peripheral regions 321-1, 321-2. Formed at the bottom of the trench beneath intended locations of narrow, tall dielectric isolation structures, which are to be subsequently formed within the trench, are doped isolation regions 311-1, 311-2.

FIG. 3B shows forming a dielectric layer 312 within the trench 322. The dielectric layer may have attributes the same as or similar to the dielectric layer 212 of FIG. 2B. The top major surface of the dielectric layer is substantially coplanar with the top major surface of the semiconductor substrate. If appropriate, a planarization operation (e.g., CMP) may be used to make these surfaces coplanar.

FIG. 3C shows narrow, tall dielectric isolation structures 315-1, 315-2, epitaxial semiconductor material 319-1, 319-2, 319-3, and diffused doped sidewall liners 318, formed within the region formerly occupied by the dielectric layer 312. The resulting structure within the trench region is similar to the structure of FIG. 2J. These structures may be performed substantially as previously described with respect to FIGS. 2B-2J. For example, operations may include depositing and patterning a photoresist layer (as in FIGS. 2C-D), etching narrow, tall dielectric isolation structures from the dielectric layer 312 (as in FIGS. 2E-F), depositing a thin conformal doped layer and removing lateral portions of the thin, conformal doped layer (as in FIGS. 2G-H, growing a layer of an epitaxial semiconductor material 319-1, 319-2, 319-3 around the narrow, tall dielectric isolation structures 315-1, 315-2 (as in FIG. 2I), and diffusing the dopant into the epitaxial semiconductor material 319-1, 319-2, 319-3 (as in FIG. 2J).

Advantageously, such an approach may allow the epitaxial semiconductor material 319-1, 319-2, 319-3 to be formed as a different type of semiconductor material than the semiconductor substrate 310. As previously mentioned, this may help to avoid needing to alter known conventional processes used to form the peripheral regions/circuits.

Figure 4:
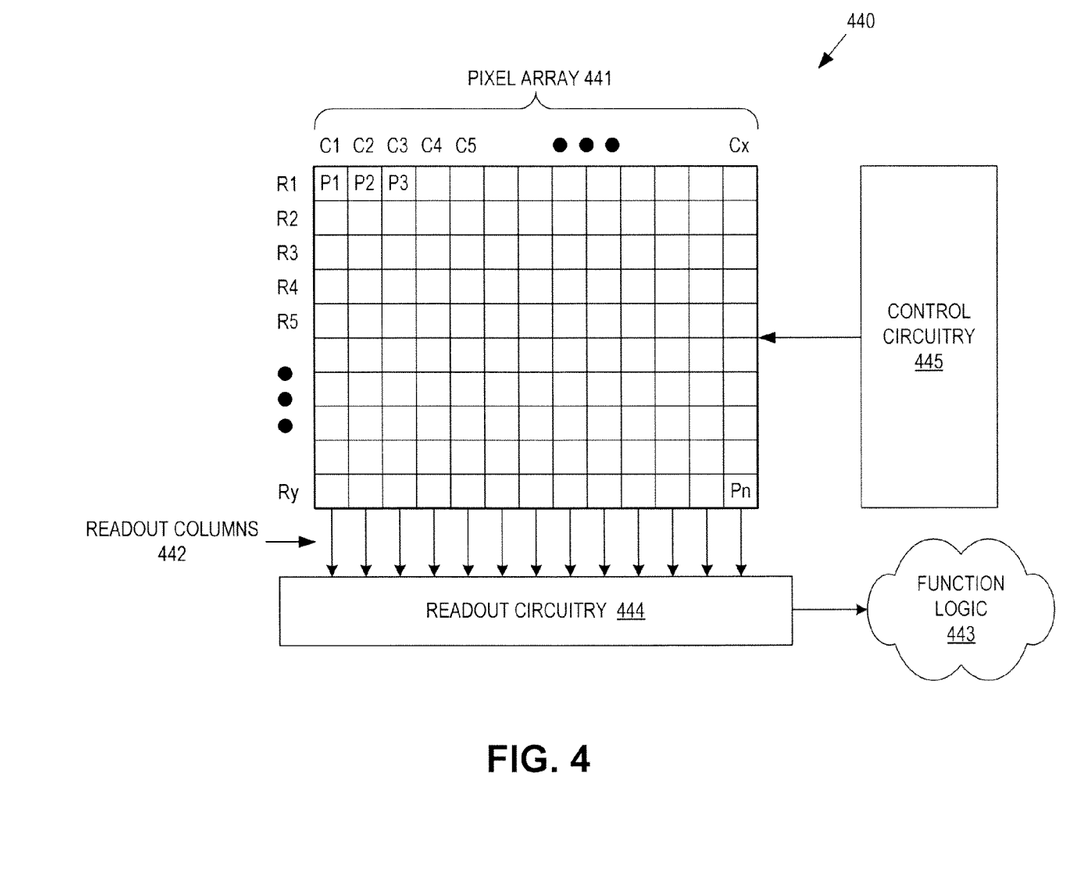
FIG. 4 is a block diagram of an example embodiment of an image sensor system having a pixel array that may be manufactured by approaches disclosed herein.

FIG. 4 is a block diagram of an example embodiment of an image sensor system 440. The illustrated embodiment of the image sensor system includes a pixel array 441, readout circuitry 444, function logic 443, and control circuitry 445. The pixel array or image sensor array includes a two-dimensional array of pixels (e.g., pixels P1, P2, P3, . . . Pn). As illustrated, the pixels of the image sensor array are arranged into rows (e.g., rows R1 through Ry) and columns (e.g., column C1 through Cx). Commonly there are numerous rows and numerous columns. During image acquisition, each of the pixels may acquire image data (e.g., an image charge). In one embodiment, each pixel is a complementary metal oxide semiconductor (CMOS) pixel. In another embodiment, each pixel is a charge coupled device (CCD) type pixel. The image sensor array may be implemented as either a front side illuminated (FSI) image sensor array or a backside illuminated (BSI) image sensor array. The image sensor array may be either color or black and white. The image sensor array may be used to acquire image data (e.g., 2D images and/or video).

After each pixel has acquired its image data or image charge, the image data is readout by the readout circuitry 444 and transferred to the function logic 443. The readout circuitry may readout a row of image data at a time along readout column lines 442, or readout the image data using column readout, serial readout, full parallel readout of all pixels concurrently, etc. In one aspect, the function logic may merely store the image data, or in another aspect the function logic may manipulate the image data using various ways known in the arts (e.g., crop, rotate, remove red eye, adjust brightness, adjust contrast, etc). The function logic may be implemented in hardware, software, firmware, or a combination. The control circuitry 445 is coupled to the pixel array to control operational characteristics of the pixel array. For example, the control circuitry may generate a shutter signal for controlling image acquisition. The shutter signal may be a global shutter signal or a rolling shutter signal.

In the description above, for the purposes of explanation, numerous specific details have been set forth in order to provide a thorough understanding of the embodiments of the invention. It will be apparent however, to one skilled in the art, that one or more other embodiments may be practiced without some of these specific details. The particular embodiments described are not provided to limit the invention but to illustrate it. It will also be appreciated, by one skilled in the art, that modifications may be made to the embodiments disclosed herein, such as, for example, to the sizes, shapes, configurations, forms, functions, materials, of the components of the embodiments. The scope of the invention is not to be determined by the specific examples provided above but only by the claims below.

In other instances, well-known structures, devices, and operations have been shown in block diagram form or without detail in order to avoid obscuring the understanding of the description. For simplicity and clarity of illustration, elements illustrated in the figures have not necessarily been drawn to scale. For example, the dimensions of some of the elements are exaggerated relative to other elements for clarity. Further, where considered appropriate, reference numerals or terminal portions of reference numerals have been repeated among the figures to indicate corresponding or analogous elements, which may optionally have similar characteristics.

It should also be appreciated that reference throughout this specification to "one embodiment", "an embodiment", or "one or more embodiments", for example, means that a particular feature may be included in the practice of the invention. Similarly, it should be appreciated that in the description various features are sometimes grouped together in a single embodiment, Figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

What is claimed is:

1. A method of forming isolation structures for an image sensor array, the method comprising:
   forming a dielectric layer over a semiconductor substrate;
   forming narrow, tall dielectric isolation structures from the dielectric layer, wherein the narrow, tall dielectric isolation structures have a width that is no more than 0.3 micrometers and a height that is at least 1.5 micrometers;
   epitaxially growing a semiconductor material around the narrow, tall dielectric isolation structures; and
   forming pixels in the epitaxially grown semiconductor material.

2. The method of claim 1, wherein forming the narrow, tall dielectric isolation structures comprises:
   forming a patterned photoresist layer over the dielectric layer; and
   etching the narrow, tall dielectric isolation structures from the dielectric layer through the patterned photoresist layer with an anisotropic etch.

3. The method of claim 2, wherein etching the narrow, tall dielectric isolation structures from the dielectric layer comprises performing a reactive ion etch.

4. The method of claim 1, wherein forming the narrow, tall dielectric isolation structures comprises forming narrow, tall dielectric isolation structures that have a width that is no more than 0.25 micrometers and a height that is at least 1.7 micrometers.

5. The method of claim 1, wherein epitaxially growing the semiconductor material comprises selectively epitaxially growing the semiconductor material.

6. The method of claim 1, further comprising, prior to epitaxially growing the semiconductor material, forming thin, conformal doped sidewall liners along sidewalls of the narrow, tall dielectric isolation structures.

7. The method of claim 6, wherein forming the doped sidewall liners comprises:
   depositing a thin, conformal doped layer, having a thickness of between 30 and 70 nanometers, over top surfaces and along the sidewalls of the narrow, tall dielectric isolation structures, and over a top major surface of the semiconductor substrate, by performing an atomic layer deposition; and
   removing portions of the thin, conformal doped layer from over the top surfaces of the narrow, tall dielectric isolation structures and from over the top major surface of the semiconductor substrate by performing an anisotropic etch.

8. The method of claim 6, wherein the thin, conformal doped sidewall liners comprise a doped semiconductor material.

9. The method of claim 1, further comprising etching a trench in the semiconductor substrate, and wherein forming the dielectric layer comprises forming the dielectric layer within the trench.

10. The method of claim 1, wherein the semiconductor substrate comprises a highly doped semiconductor substrate, and wherein the dielectric layer is formed over a top major surface of the highly doped semiconductor substrate without an epitaxial layer disposed between the semiconductor substrate and the dielectric layer.

11. A method of forming isolation structures for an image sensor array, the method comprising:

forming a dielectric layer over a semiconductor substrate;

forming narrow, tall dielectric isolation structures from the dielectric layer, wherein the narrow, tall dielectric isolation structures have a width that is no more than 0.3 micrometers and a height that is at least 1.5 micrometers;

epitaxially growing a semiconductor material around the narrow, tall dielectric isolation structures;

prior to epitaxially growing the semiconductor material, forming thin, conformal doped sidewall liners along sidewalls of the narrow, tall dielectric isolation structures; and after epitaxially growing the semiconductor material, thermally diffusing dopant from the thin, conformal doped sidewall liners into the epitaxially grown semiconductor material.

* * * * *